(12) United States Patent
Enami et al.

(10) Patent No.: US 9,065,317 B2
(45) Date of Patent: Jun. 23, 2015

(54) FIXING STRUCTURE FOR ELECTRICAL COMPONENT

(75) Inventors: Shingo Enami, Kariya (JP); Ken Suitou, Kariya (JP); Yusuke Kinoshita, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 569 days.

(21) Appl. No.: 13/343,203

(22) Filed: Jan. 4, 2012

(65) Prior Publication Data

US 2012/0175981 A1 Jul. 12, 2012

(30) Foreign Application Priority Data

Jan. 6, 2011 (JP) .................................. 2011-001431
Dec. 27, 2011 (JP) .................................. 2011-286775

(51) Int. Cl.
*H05K 7/20* (2006.01)
*H02K 11/00* (2006.01)
(Continued)

(52) U.S. Cl.
CPC .............. *H02K 11/0073* (2013.01); *H02K 9/22* (2013.01); *H05K 7/20454* (2013.01); *H05K 7/20463* (2013.01); *H05K 7/209* (2013.01)

(58) Field of Classification Search
CPC ................... G06F 1/16–1/1654; G06F 1/656; G06F 1/1662–1/1681; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/069; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ....................... 361/679.46–679.54, 688–723; 165/80.1–80.5, 104.33, 185; 257/712–722; 174/15.1–15.2, 174/16.1–16.3, 521, 526, 547–548

See application file for complete search history.

(56) References Cited

U.S. PATENT DOCUMENTS 5,878,589 A * 3/1999 Tanaka et al. ................... 62/199
5,966,291 A * 10/1999 Baumel et al. ................. 361/707

(Continued)

FOREIGN PATENT DOCUMENTS

CN 101064454 A 10/2007
CN 101600326 A 12/2009
(Continued)

OTHER PUBLICATIONS

Office Action dated Jan. 20, 2014, issued by the State Intellectual Property Office of P.R.C. in corresponding Chinese Application No. 201110460633.7.

(Continued)

*Primary Examiner* — Michail V Datskovskiy
*Assistant Examiner* — Razmeen Gafur
(74) *Attorney, Agent, or Firm* — Sughrue Mion, PLLC (57) ABSTRACT

A fixing structure for an electrical component includes a heat removing member for removing heat from the electrical component. The heat removing member has a receiving portion for receiving the electrical component. The fixing structure for an electrical component further includes a separation member that is coupled to the electrical component to separate the electrical component from the heat removing member. The separation member is coupled to the heat removing member. The fixing structure for an electrical component includes a soft material member that is accommodated in the receiving portion to contact the receiving portion and the electrical component. Heat of the electrical component is transmitted to the heat removing member via the soft material member.

6 Claims, 4 Drawing Sheets

(51) Int. Cl.
*H01L 23/473* (2006.01)
*H02K 9/22* (2006.01)

(56) References Cited

U.S. PATENT DOCUMENTS

| | | | |
|---|---|---|---|
| 7,176,707 B1 | 2/2007 | Hokenson | |
| 7,710,726 B2 * | 5/2010 | Sugiyama et al. | 361/704 |
| 7,819,172 B2 * | 10/2010 | Otsuka et al. | 165/80.3 |
| 8,007,255 B2 * | 8/2011 | Hattori et al. | 417/410.1 |
| 8,107,255 B2 * | 1/2012 | Sakamoto et al. | 361/792 |
| 8,324,769 B2 * | 12/2012 | Clendenen | 310/68 D |
| 8,441,827 B2 * | 5/2013 | Baker et al. | 363/141 |
| 8,451,611 B2 * | 5/2013 | Nakagami et al. | 361/714 |
| 8,553,414 B2 * | 10/2013 | Chinthavali | 361/697 |
| 8,693,193 B2 * | 4/2014 | Ishibashi et al. | 361/688 |
| 8,897,013 B2 * | 11/2014 | Sharaf et al. | 361/702 |
| 2001/0004313 A1 | 6/2001 | Yamaoka | |
| 2004/0246683 A1 * | 12/2004 | Honsberg-Riedl et al. | 361/720 |
| 2007/0000231 A1 * | 1/2007 | Otsuka et al. | 60/203.1 |
| 2007/0058350 A1 * | 3/2007 | Nakamura | 361/704 |
| 2007/0201209 A1 * | 8/2007 | Francis et al. | 361/704 |
| 2007/0217159 A1 * | 9/2007 | Long et al. | 361/704 |
| 2007/0252451 A1 | 11/2007 | Shibuya et al. | |
| 2008/0116838 A1 * | 5/2008 | Hattori et al. | 318/722 |
| 2008/0141693 A1 | 6/2008 | Enami et al. | |
| 2008/0316710 A1 * | 12/2008 | Seto et al. | 361/704 |
| 2009/0040724 A1 * | 2/2009 | Nishikimi et al. | 361/699 |
| 2009/0103276 A1 * | 4/2009 | Sakamoto et al. | 361/792 |
| 2009/0301692 A1 | 12/2009 | Oikawa | |
| 2010/0025126 A1 * | 2/2010 | Nakatsu et al. | 180/65.1 |
| 2010/0097765 A1 * | 4/2010 | Suzuki et al. | 361/699 |
| 2010/0097768 A1 * | 4/2010 | Ishii et al. | 361/719 |
| 2010/0254089 A1 * | 10/2010 | Anderl et al. | 361/702 |
| 2010/0302738 A1 * | 12/2010 | Tanaka | 361/710 |
| 2010/0328885 A1 * | 12/2010 | Scofield et al. | 361/695 |
| 2011/0051371 A1 * | 3/2011 | Azuma et al. | 361/699 |
| 2011/0095659 A1 * | 4/2011 | Hattori et al. | 310/68 D |
| 2012/0098366 A1 | 4/2012 | Yamasaki et al. | |
| 2012/0098391 A1 | 4/2012 | Yamasaki et al. | |
| 2012/0160460 A1 | 6/2012 | Oikawa | |

FOREIGN PATENT DOCUMENTS

| | | |
|---|---|---|
| EP | 1 930 596 A2 | 6/2008 |
| JP | 2000-013063 A | 1/2000 |
| JP | 2001-168562 A | 6/2001 |
| JP | 2007-295639 A | 11/2007 |
| JP | 2008-133729 A | 6/2008 |
| JP | 2010041735 A | 2/2010 |
| WO | 2009/037075 A1 | 3/2009 |
| WO | 2010/150527 A1 | 12/2010 |

OTHER PUBLICATIONS

Communication dated Sep. 30, 2014 from the European Patent Office in counterpart application No. 12150050.8.

* cited by examiner

FIXING STRUCTURE FOR ELECTRICAL COMPONENT

BACKGROUND OF THE INVENTION

The present invention relates to a fixing structure for an electrical component.

To improve the insulation performance and heat radiation performance (cooling performance) of an electrical component, Japanese Laid-Open Patent Publication No. 2007-295639 discloses that a coil (electrical component) for driving a motor in an electric compressor is arranged to face a housing with a fluid member in between. If the housing is made of a material having high thermal conductivity such as aluminum and the fluid member is formed to be thin, the heat radiation performance of an electrical component is improved. Also, if a material having excellent insulation performance is used as the fluid member, the insulation performance for the electrical component is improved.

Typically, an electrical component is attached to a substrate before being installed in a housing. To improve the heat radiation performance, an electrical component is positively brought into contact with a member of some sort. Therefore, stress acting on soldering portions between an electrical component and a substrate can damage the soldering portions. In some cases, the coating of an electrical component can be damaged so that the insulation performance of the electrical component is degraded. These drawbacks are particularly prominent in coils, which have relatively great weights among electrical components.

SUMMARY OF THE INVENTION

Accordingly, it is an objective of the present invention to provide a fixing structure for an electrical component that is capable of cooling the electrical component and eliminates the drawbacks during the assembly.

To achieve the foregoing objective and in accordance with one aspect of the present invention, a fixing structure for an electrical component is provided that includes a heat removing member, a separation member, and a soft material member. The heat removing member removes heat from an electrical component, and has a receiving portion for receiving the electrical component. The separation member is coupled to the electrical component to separate the electrical component from the heat removing member. The separation member is coupled to the heat removing member. The soft material member is accommodated in the receiving portion to contact the receiving portion and the electrical component. Heat of the electrical component is transmitted to the heat removing member via the soft material member.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

A fixing structure for a coil in an electric compressor according to a first embodiment of the present invention will be described with reference to FIGS. 1 and 2.

Figure 1:
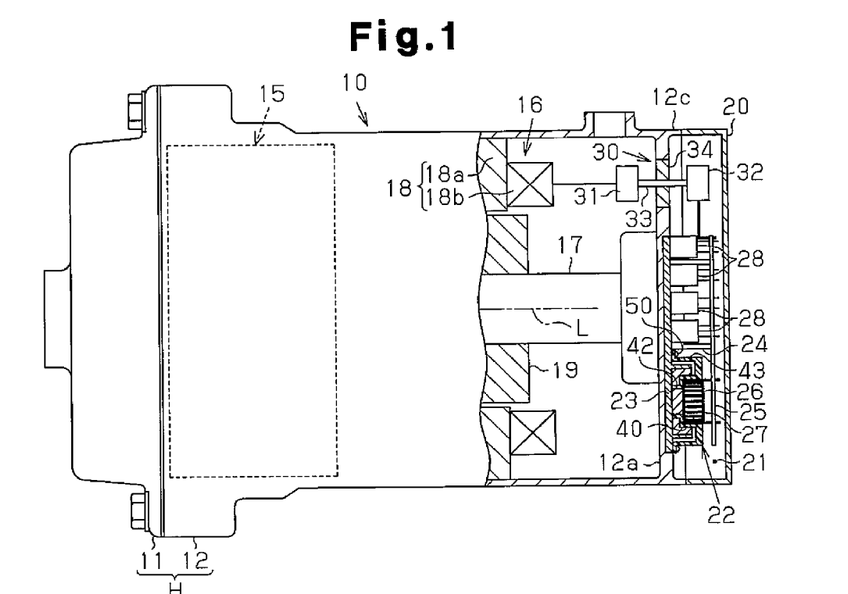
FIG. 1 is a partial cross-sectional view, with a portion cut away, illustrating an electric compressor according to one embodiment.

As shown in FIG. 1, a housing H of an electric compressor 10 includes a cylindrical aluminum first housing member 11 (on the left in FIG. 1) with a closed end and a cylindrical aluminum second housing member 12 (on the right in FIG. 1) with a closed end. The first and second housing members 11, 12 each have an open end. The open end of the first housing member 11 is held in contact with the open end of the second housing member 12. In the housing H, an electric motor 16 is accommodated at a position closer to a bottom wall 12a of the second housing member 12 (the right end in FIG. 1). Also, a compressing portion 15 is accommodated in the first housing member 11 (the left end in FIG. 1).

A stator 18 of the electric motor 16 is fixed to the inner circumferential surface of the second housing member 12. The stator 18 has a stator core 18a, about which a motor coil 18b is wound. A rotary shaft 17 is rotationally supported in the housing H via bearings (not shown). A rotor 19 of the electric motor 16 is fixed to the rotary shaft 17 to rotate integrally with the rotary shaft 17. The rotary shaft 17 is rotated as the electric motor 16 operates, which drives the compressing portion 15.

An annular circumferential wall 12c extends in a direction opposite to the first housing member 11, from the periphery of the outer surface of the bottom wall 12a of the second housing member 12. An open end of an inverter cover 20, which is shaped as a box with a closed end, is held in contact with the open end of the circumferential wall 12c. An accommodating space 21 is defined by the bottom wall 12a, the circumferential wall 12c, and the inverter cover 20 to accommodate an inverter 22, which is a circuit for controlling operation of the electric motor 16.

The inverter 22 is attached to the outer surface of the bottom wall 12a with a heat removing member 23 in between. The heat removing member 23 is a plate made of aluminum, which has high thermal conductivity, is thermally coupled to the bottom wall 12a. A substrate support member 24 is fixed to the heat removing member 23. The distal end of the substrate support member 24 supports a substrate 25 of the inverter 22. The inverter 22 is assembled to the electric compressor 10 such that the mounting surface of the substrate 25 is perpendicular to the direction of the center axis L (axial direction) of the rotary shaft 17. Therefore, in the present embodiment, the compressing portion 15, the electric motor 16, and the inverter 22 are arranged in order along the axial direction of the rotary shaft 17. Electrical components include switching elements (not shown), and a filter coil 27 and capacitors 28, which function as a noise filter. These components are mounted on the substrate 25 via soldering portions (not shown).

A sealed terminal 30 is fixed to a part of the bottom wall 12a that is close to the outer periphery (in the upper portion as viewed in FIG. 1). The sealed terminal 30 electrically connects the motor coil 18b of the electric motor 16 to the inverter 22. The sealed terminal 30 is formed by integrating a conducting pin 33 and an insulating member 34. The conducting pin 33 connects a motor-side connector 31, which is connected to the motor coil 18b, to a substrate-side connector 32, which is connected to the substrate 25. The insulating member 34 fixes the conducting pin 33 to the bottom wall 12a while insulating the conducting pin 33 from the bottom wall 12a.

The structure for fixing the filter coil 27 to the heat removing member 23 will now be described.

Figure 2:
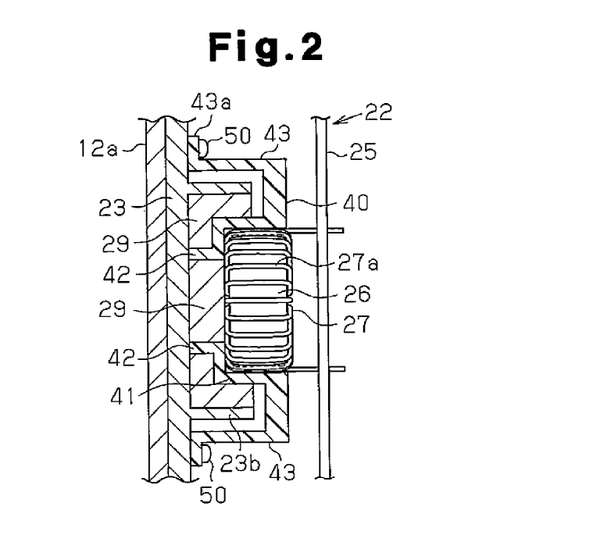
FIG. 2 is a diagram illustrating a fixing structure for a filter coil according to a first embodiment.

As shown in FIG. 2, the filter coil 27 is formed by winding a wire 27a about an annular core 26. The starting point and end point of the wire 27a are connected to the substrate 25 via soldering portions (not shown). The filter coil 27 is thus mounted on the substrate 25. The filter coil 27 is received in an accommodating portion 23b, which serves as a receiving portion and an annular wall. The annular accommodating portion 23b extends from the heat removing member 23 along the axial direction of the rotary shaft 17. The accommodating portion 23b is filled with a soft material member, which is a cooling gel 29. In addition to heat conductivity, the cooling gel 29 has sufficient adhesion property and shape retention property such that the gel 29 does not leak from the accommodating portion 23b regardless of the installed orientation of the electric compressor 10.

The filter coil 27 is incorporated in the accommodating portion 23b while being integrated with (coupled to) a resin separation member 40, and fixed to (coupled to) the heat removing member 23 via the separation member 40. The entire outer circumference of the filter coil 27 is covered and retained by a retaining portion 41 of the separation member 40. The separation member 40 is formed by placing the filter coil 27 in a frame (not shown) and filling the frame with molten resin, so that the filter coil 27 is immovably integrated with the retaining portion 41.

Legs 42 protrude from an end face of the retaining portion 41 that faces the heat removing member 23. The distal ends of the legs 42 contact the heat removing member 23. The protruding length of the legs 42 from the retaining portion 41 is sufficient to allow such contact between the legs 42 and the heat removing member 23 to insulate the filter coil 27 from the heat removing member 23. A part of the filter coil 27 that is radially inside of the legs 42 is not covered with resin.

Fixing legs 43 are formed on the outer circumferential surface of the retaining portion 41. The fixing legs 43 first extend outward from the outer circumferential surface of the retaining portion 41 over the accommodating portion 23b, and then turn and extend toward the heat removing member 23. A fixing piece 43a is formed at the distal end of each fixing leg 43. A screw 50 is passed through each fixing piece 43a and threaded to the heat removing member 23, so that the separation member 40 is fixed to (coupled to) the heat removing member 23.

With the separation member 40 fixed to the heat removing member 23, the half of the filter coil 27 that corresponds to the heat removing member 23 is located in the accommodating portion 23b, and a part of the filter coil 27 that is exposed from the retaining portion 41 contact the cooling gel 29. By the contact between the legs 42 and the heat removing member 23, the filter coil 27 is positioned to be isolated from the heat removing member 23 by the distance corresponding to the length of the legs 42.

When securing the inverter 22, which has the filter coil 27, to the heat removing member 23, the filter coil 27 retained by the separation member 40 is prepared. Then, the accommodating portion 23b is filled with the cooling gel 29, and the retaining portion 41 of the separation member 40 is inserted into the accommodating portion 23b. After the legs 42 contact the heat removing member 23, the screws 50 passed through the fixing pieces 43a of the fixing legs 43 are threaded to the heat removing member 23. Lastly, the substrate 25, on which electrical components such as the capacitors 28 are mounted, is placed on the filter coil 27, and the filter coil 27 is soldered to the substrate 25. As a result, the filter coil 27 is fixed to the heat removing member 23 via the separation member 40 by screws 50, and the inverter 22 is fixed to the heat removing member 23. The substrate 25 contacts and is supported by the substrate support member 24, and the capacitors 28 contact the heat removing member 23.

Operation of the structure for fixing the filter coil 27 will now be described.

The filter coil 27 is immovably retained by the retaining portion 41 of the separation member 40, and the separation member 40 is fixed to the heat removing member 23 by the fixing legs 43. Accordingly, even if the electric compressor 10 vibrates, the vibration is absorbed by the separation member 40, so that the filter coil 27 is prevented from vibrating. Further, the filter coil 27 is fixed to the heat removing member 23 by means of the separation member 40. Therefore, the filter coil 27 alone can be assembled with the heat removing member 23, separately from the assembly of the substrate 25.

Further, the filter coil 27 is inserted into the accommodating portion 23b of the heat removing member 23. A part of the filter coil 27 that is radially inside of the legs 42 is not covered with resin and contacts the cooling gel 29 in the accommodating portion 23b. This contact causes some of the heat generated by energizing the filter coil 27 to be removed by the heat removing member 23 via the cooling gel 29. The heat removing effect cools the filter coil 27. In addition, the contact of the legs 42 with the heat removing member 23 insulates the filter coil 27 from the heat removing member 23.

The first embodiment has the following advantages.

(1) The annular accommodating portion 23b extends from the heat removing member 23. The filter coil 27 is incorporated in the accommodating portion 23b filled with the cooling gel 29 and contacts the cooling gel 29. The filter coil 27 is therefore cooled by the heat removing effect of the cooling gel 29 and the heat removing member 23.

(2) The filter coil 27 is fixed to the heat removing member 23 by means of the separation member 40. Therefore, the filter coil 27 alone can be assembled with the heat removing member 23, separately from the assembly of the substrate 25. Thus, unlike a case where the filter coil 27 is fixed only to the substrate 25, the separation member 40 prevents the filter coil 27 from contacting the second housing member 12 and the heat removing member 23 when the filter coil 27 is placed in the accommodating space 21. Therefore, the coating of the filter coil 27 is prevented from being damaged. Further, the filter coil 27 is not only suspended from the substrate 25, but also retained by the separation member 40. Therefore, stress does not act only on the soldering portions between the filter coil 27 and the substrate 25, and the soldering portions are not damaged.

(3) In the separation member 40, the legs 42 extend from the retaining portion 41, which retains the filter coil 27. Therefore, with the separation member 40 fixed to the heat removing member 23, the legs 42 contact the heat removing member 23, so that the filter coil 27 is isolated from the heat removing member 23. The filter coil 27 is thus reliably insulated from the heat removing member 23 by the legs 42.

(4) The separation member 40 is fixed to the heat removing member 23 by the screws 50. Therefore, even if the electric compressor 10 vibrates, the separation member 40 is prevented from being displaced, and the filter coil 27 can be positioned in the accommodating portion 23b. The separation member 40 is fixed to the heat removing member 23 by the fixing legs 43, which extend to the outside of the accommodating portion 23b, to the heat removing member 23 by the screws 50. If parts for fixing the separation member 40 to the heat removing member 23, or the fixing legs 43, are located in the accommodating portion 23b, the cooling gel 29 would leak. The present embodiment eliminates such a drawback. The cooling gel 29 is thus retained in the accommodating portion 23b, so that the heat removing effect of the heat removing member 23 via the cooling gel 29 is prevented from being lowered.

(5) The filter coil 27 is a relatively heavy component. Therefore, if the filter coil 27 is fixed to the substrate 25 at the ends of its wire, the filter coil 27 would be easily vibrated, significantly unstable, and easily influenced by vibration of the electric compressor 10. However, since the filter coil 27 is integrated with the separation member 40, and the separation member 40 is fixed to the heat removing member 23, vibration of the filter coil 27 is effectively suppressed.

(6) The inverter 22 is arranged such that the mounting surface of the substrate 25 is perpendicular to the axial direction of the electric compressor 10. The filter coil 27 of the inverter 22 is inserted into the annular accommodating portion 23b. The accommodating portion 23b extends from the heat removing member 23 along the axial direction of the electric compressor 10. The accommodating portion 23b is filled with the cooling gel 29 for cooling the filter coil 27. Therefore, the accommodating portion 23b prevents the cooling gel 29 from flowing to a position where the cooling gel 29 cannot contact the filter coil 27. The heat removing effect from the filter coil 27 using the cooling gel 29 is thus maintained.

(7) In the separation member 40, the legs 42 extend from the retaining portion 41, which retains the filter coil 27. Therefore, when inserting the filter coil 27 into the accommodating portion 23b, and the legs 42 contact the heat removing member 23, it is possible to check whether the filter coil 27 is at a sufficient insulating distance from the heat removing member 23. This facilitates the fixation of the inverter 22.

(8) When the inverter 22 is fixed to the heat removing member 23, the accommodating portion 23b is inserted into the filter coil 27 after filling the accommodating portion 23b with the cooling gel 29. This pushes the filter coil 27 into the cooling gel 29, ensuring contact between the filter coil 27 and the cooling gel 29. Compared to a case where the accommodating portion 23b is filled with the cooling gel 29 after the filter coil 27 is inserted into the accommodating portion 23b, the accommodating portion 23b, the separation member 40 does not hamper the filling process, so that the accommodating portion 23b is easily filled with the cooling gel 29.

(9) The filter coil 27 of the inverter 22 is immovably integrated with the separation member 40 by resin molding. The separation member 40 is fixed to the heat removing member 23 at a position outside of the accommodating portion 23b. This allows the filter coil 27 to be positioned and retained in the retaining portion 41. Also, since vibration of the electric compressor 10 is absorbed by the separation member 40, vibration of the filter coil 27 is suppressed.

Second Embodiment

A second embodiment of the present invention will now be described with reference to FIG. 3. In the following description, like or the same reference numerals are given to those components that are like or the same as the corresponding components of the first embodiment and detailed explanations are omitted or simplified.

Figure 3:
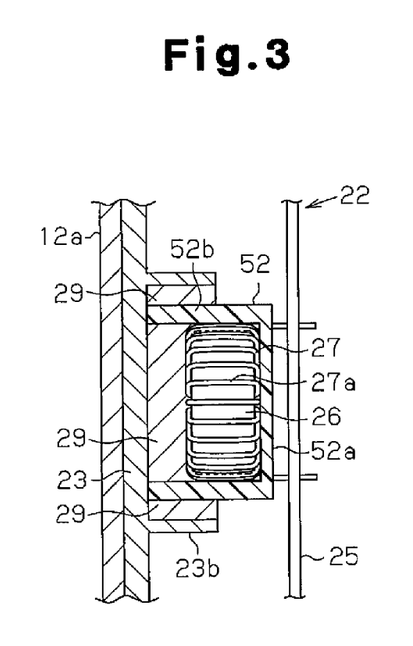
FIG. 3 is a diagram illustrating a fixing structure for a filter coil according to a second embodiment.

As shown in FIG. 3, an separation member 52 of the second embodiment includes a disk-shaped bottom plate 52a and an annular side wall 52b that protrudes from the periphery of the bottom plate 52a, so that the separation member 52 has a cylindrical shape with a bottom and an opening toward the heat removing member 23. The filter coil 27 is fitted in the separation member 52 to contact the inner surface of the bottom plate 52a of the separation member 52, and the inner surface of the side wall 52b is pressed against the filter coil 27. Accordingly, the filter coil 27 is coupled to and retained in the separation member 52. The protruding length of the side wall 52b from the bottom plate 52a is longer than the axial length of the filter coil 27. Further, the protruding length of the side wall 52b from the bottom plate 52a is sufficient to ensure insulation between the filter coil 27 and the heat removing member 23 with the distal end of the side wall 52b contacting the heat removing member 23. The separation member 52 is filled with the cooling gel 29. The opening end of the side wall 52b is bonded to the heat removing member 23 so that the separation member 52 is coupled to the heat removing member 23.

Accordingly, the second embodiment has the following advantages in addition to the advantages (1), (2), (5), (6), and (8) of the first embodiment.

(10) The filter coil 27 is retained in the separation member 52, which has a cylindrical shape with a bottom, and the side wall 52b of the separation member 52 is pressed against the outer circumferential surface of the filter coil 27. This suppresses vibration of the filter coil 27.

(11) The protruding length of the side wall 52b from the bottom plate 52a is longer than the axial length of the filter coil 27 and sufficient to ensure insulation between the filter coil 27 and the heat removing member 23 with the side wall 52b contacting the heat removing member 23. Therefore, the filter coil 27 and the heat removing member 23 can be insulated from each other simply by brining the separation member 52 and the heat removing member 23 into contact with each other.

Third Embodiment

A third embodiment of the present invention will now be described with reference to FIG. 4. In the following description, like or the same reference numerals are given to those components that are like or the same as the corresponding components of the first embodiment and detailed explanations are omitted or simplified.

Figure 4:
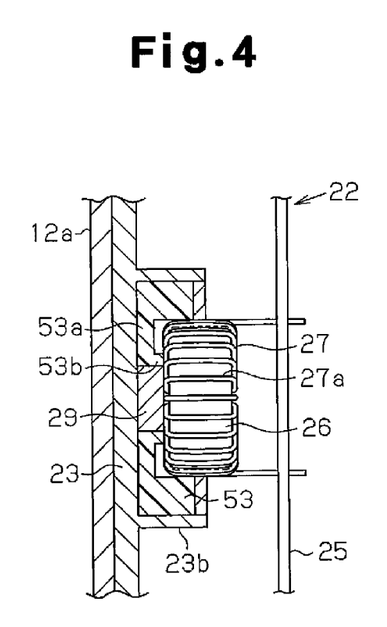
FIG. 4 is a diagram illustrating a fixing structure for a filter coil according to a third embodiment.

As shown in FIG. 4, a separation member 53 of the third embodiment is formed to be cylindrical and has arms 53a extending from a part of its inner circumferential surface that is close to the heat removing member 23. A support portion 53b projects from each arm 53a in a direction away from the heat removing member 23. The outer diameter of the separation member 53 is slightly less than the inner diameter of the accommodating portion 23b of the heat removing member 23. The inner diameter of the separation member 53 is slightly less than the outer diameter of the filter coil 27.

The separation member 53 is fitted in the accommodating portion 23b to be coupled to the heat removing member 23. The filter coil 27 is fitted in the separation member 53, so that the separation member 53 is coupled to and retained by the filter coil 27. The filter coil 27 is supported by the support portion 53b. The length of the support portion 53b along the axial direction of the filter coil 27 is sufficient to ensure insulation between the filter coil 27 and the heat removing member 23. The separation member 53 is filled with the cooling gel 29.

Accordingly, the third embodiment has the following advantages in addition to the advantages (1), (2), (5), (6), and (8) of the first embodiment.

(12) The outer diameter of the cylindrical separation member 53 is slightly less than the inner diameter of the accommodating portion 23b. The accommodating portion 23b can be easily coupled to the separation member 53 by fitting the separation member 53 in the accommodating portion 23b.

(13) The inner diameter of the cylindrical separation member 53 is slightly less than the outer diameter of the filter coil 27. The arm 53a extends from a part of the inner circumferential surface of the separation member 53 that is close to the heat removing member 23. The support portion 53b projects from the arm 53a. Therefore, by simply fitting the filter coil 27 into the separation member 53, the filter coil 27 can be coupled to and retained by the separation member 53. Also, the filter coil 27 can be supported while ensuring insulation between the filter coil 27 and the heat removing member 23.

Fourth Embodiment

A fourth embodiment of the present invention will now be described with reference to FIG. 5. In the following description, like or the same reference numerals are given to those components that are like or the same as the corresponding components of the first embodiment and detailed explanations are omitted or simplified.

Figure 5:
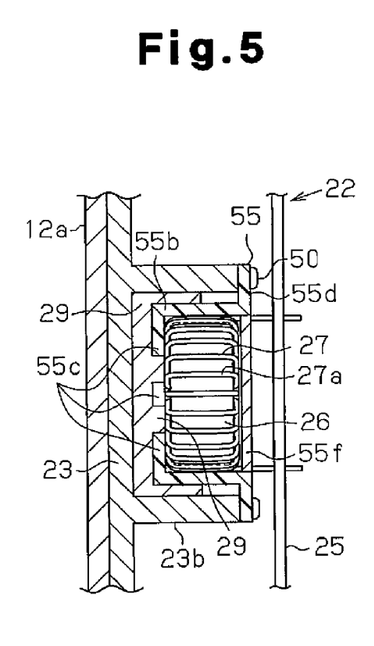
FIG. 5 is a diagram illustrating a fixing structure for a filter coil according to a fourth embodiment.

As shown in FIG. 5, an separation member 55 of the fourth embodiment includes an annular side wall 55b, contact pieces 55c extending toward the center of the separation member 55 from the inner surface of the open end of the side wall 55b close to the heat removing member 23, and a rim 55d that extends from the outer circumference surface of the side wall 55b to reach the end face of the accommodating portion 23b. The filter coil 27 is fitted in the separation member 55 to contact the contact pieces 55c. Accordingly, the filter coil 27 is coupled to and retained in the separation member 55.

The separation member 55, which accommodates the filter coil 27, has an open end close to the substrate 25. The open end close to the substrate 25 is sealed by a lid member 55f. The lid member 55f is inserted into the separation member 55, and the inner surface of the lid member 55f is bonded to the outer surface of the separation member 55 with adhesive. The end face of the lid member 55f that faces the inverter 22 is flush with the end face of the rim 55d that faces the inverter 22. A screw 50 is passed through the rim 55d and threaded to the end face of the accommodating portion 23b, in which cooling gel is contained in advance. Accordingly, with the lid member 55f bonded thereto, the separation member 55, which accommodates the filter coil 27, is fixed to (coupled to) the heat removing member 23.

The length of the accommodating portion 23b along the axial direction of the filter coil 27 is longer than the length from the rim 55d to each contact piece 55c. Further, the length from the end face of the filter coil 27 that faces the heat removing member 23 to the heat removing member 23 is long enough to ensure insulation between the filter coil 27 and the heat removing member 23 when the rim 55d is threaded to the end face of the accommodating portion 23b. The cooling gel 29 enters the separation member 55 through clearances between the contact pieces 55c and contacts the filter coil 27.

Accordingly, the fourth embodiment has the following advantages in addition to the advantages (1), (2), (4), (5), (6), and (8) of the first embodiment.

(14) The separation member 55 is shaped to be annular and has the contact pieces 55c at the open end. The separation member 55 has the rim 55d, which is threaded to the end face of the accommodating portion 23b. The contact pieces 55c and the rim 55d separate the filter coil 27 from the heat removing member 23. The filter coil 27 is thus insulated from the heat removing member 23.

(15) The separation member 55, which accommodates the filter coil 27, has an open end close to the substrate 25, and the open end is sealed by the lid member 55f. Accordingly, the filter coil 27 is reliably retained in the separation member 55.

Each of the embodiments may be modified as follows.

Figure 6:
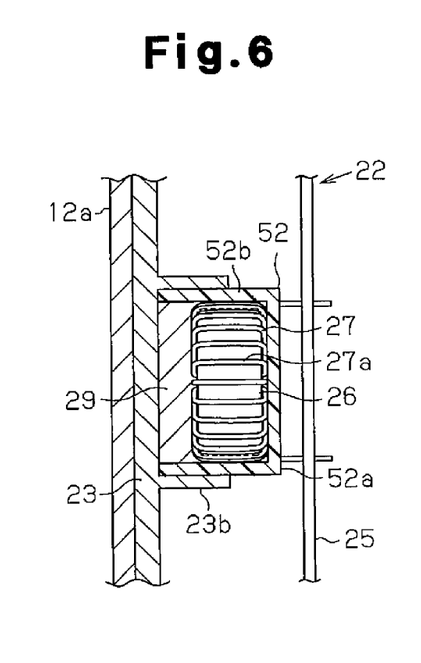
FIGS. 6 to 11 are diagrams of modified embodiments, each illustrating a fixing structure for a filter coil that uses a separation member.

The separation member 52 of the second embodiment may be modified as shown in FIG. 6. That is, the side wall 52b of the separation member 52 may be fitted in the accommodating portion 23b. In this case, the separation member 52 can be easily coupled to the accommodating portion 23b. Even if the electric compressor 10 vibrates, the outer surface of the side wall 52b instantly contacts the inner surface of the accommodating portion 23b. Therefore, vibration of the filter coil 27 is reliably suppressed by the separation member 52.

Figure 7:
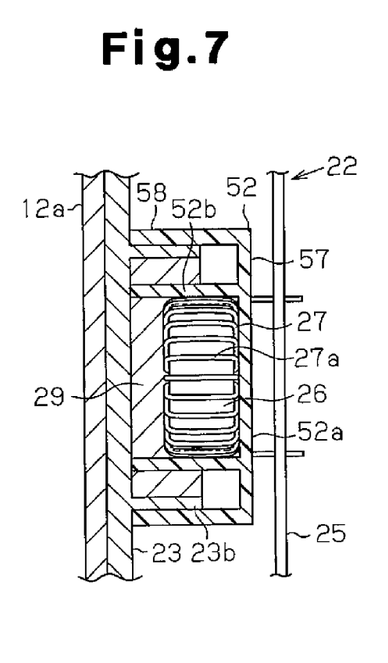

The separation member 52 of the second embodiment may be modified as shown in FIG. 7. That is, an outwardly extending rim 57 may be formed on the outer circumference surface of the side wall 52b of the separation member 52, and an annular portion, or an outer wall 58, may be formed on the periphery of the rim 57. The inner diameter of the outer wall 58 is slightly greater than the outer diameter of the accommodating portion 23b. The outer wall 58 may be fitted from outside about the accommodating portion 23b to couple the separation member 52 to the heat removing member 23. In this case, the separation member 52 can be easily coupled to the heat removing member 23. If the electric compressor 10 vibrates, the inner surface of the outer wall 58 instantly contacts the outer surface of the accommodating portion 23b. Therefore, vibration of the filter coil 27 is reliably suppressed by the separation member 52.

Figure 8:
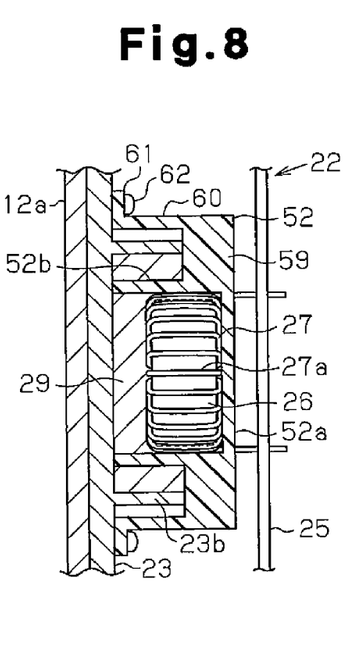

The separation member 52 of the second embodiment may be modified as shown in FIG. 8. That is, extensions 59 are formed on the outer circumferential surface of the side wall 52b of the separation member 52. The extensions 59 extend beyond the accommodating portion 23b. A fixing arm 60 extends from each extension 59 toward the opening of the separation member 52 (in a direction toward the heat removing member 23). A fixing piece 61 is formed at the distal end of each fixing arm 60. A screw 62 is passed through each fixing piece 61 and threaded to the heat removing member 23, so that the separation member 52 is coupled to (fixed to) the heat removing member 23.

Since the separation member 52 is fixed to the heat removing member 23 by the screws 62, the separation member 52 is prevented from being displaced even if the electric compressor 10 vibrates, and the filter coil 27 is reliably positioned. The separation member 52 is fixed to the heat removing member 23 by the fixing arms 60, which extend to the outside of the accommodating portion 23b, to the heat removing member 23 by the screws 62. If parts for fixing the separation member 52 to the heat removing member 23, or the fixing arms 60, are located in the accommodating portion 23b, the cooling gel 29 would leak. The present embodiment eliminates such a drawback. The cooling gel 29 is thus retained in the accommodating portion 23b, so that the heat removing effect of the heat removing member 23 via the cooling gel 29 is prevented from being lowered.

Figure 9:
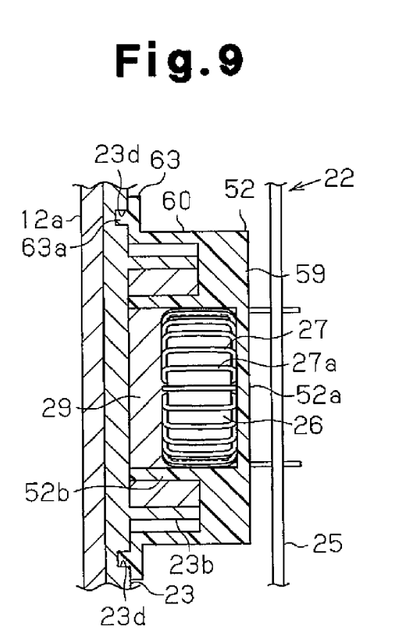

The separation member 52 of the second embodiment may be modified as shown in FIG. 9. That is, extensions 59 are formed on the outer circumferential surface of the side wall 52b of the separation member 52. The extensions 59 extend outward. A fixing arm 60 extends from each extension 59 toward the opening of the separation member 52 (in a direction toward the heat removing member 23). An outwardly extending fixing piece 63 is formed at the distal end of each fixing arm 60. An engaging portion 63a protrudes from an end face of each fixing piece 63 facing the heat removing member 23, and a corresponding engaging recess 23d is formed in the heat removing member 23. The engaging recesses 23d and the engaging portions 63a form a recess-projection engaging structure. The separation member 52 may be coupled to the heat removing member 23 by engaging the engaging portions 63a with the engaging recesses 23d. Accordingly, the separation member 52 can be coupled to the heat removing member 23 by simply engaging the engaging portions 63a with the engaging recesses 23d.

Figure 10:
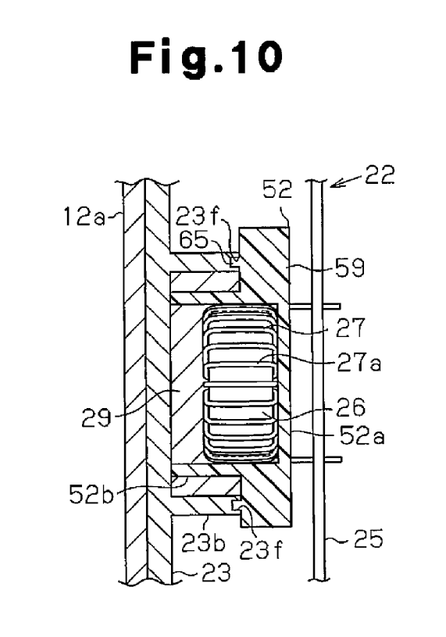

The separation member 52 of the second embodiment may be modified as shown in FIG. 10. That is, extensions 59 are formed on the outer circumferential surface of the side wall 52b of the separation member 52. The extensions 59 extend outward. An engaging portion 65 extends from each extension 59 toward the opening of the separation member 52 (in a direction toward the heat removing member 23). Engaging recesses 23f, which are engageable with the engaging portions 65, are formed at the open end of the accommodating portion 23b. The engaging recesses 23f and the engaging portions 65 form a recess-projection engaging structure. The separation member 52 may be coupled to the heat removing member 23 by engaging the engaging portions 65 of the separation member 52 with the engaging recesses 23f of the heat removing member 23. Accordingly, the separation member 52 can be coupled to the heat removing member 23 by simply engaging the engaging portions 65 with the engaging recesses 23f.

Figure 11:
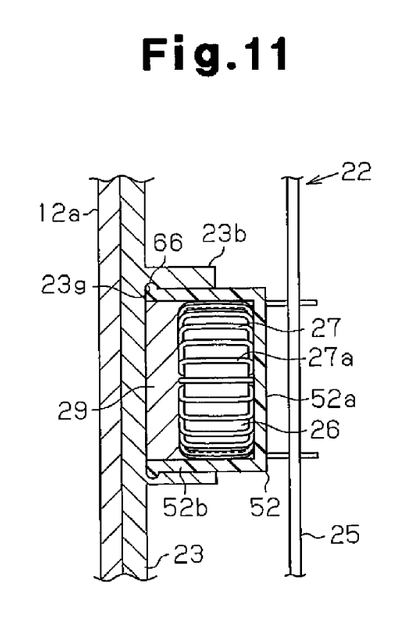

The separation member 52 of the second embodiment may be modified as shown in FIG. 11. That is, engaging portions 66 are formed on the outer circumferential surface of the side wall 52b of the separation member 52. The engaging portions 66 project outward. Engaging recesses 23g, which are engageable with the engaging portions 66, are formed on the inner circumferential surface of the accommodating portion 23b. The engaging recesses 23g and the engaging portions 66 form a recess-projection engaging structure. The separation member 52 may be coupled to the heat removing member 23 by fitting the side wall 52b of the separation member 52 into the accommodating portion 23b and engaging the engaging portions 66 with the engaging recesses 23g. This allows the separation member 52 to be easily and firmly coupled to the heat removing member 23 by two simple methods, or fitting and engagement.

In each embodiment, the filter coil 27 is used as an electrical component. That is, an separation member is coupled to the filter coil 27 to form a fixing structure. However, the capacitors 28 or the switching elements may be used as electrical components coupled to an separation member to form a fixing structure.

A coil that is fixed by the fixing structure according to each embodiment does not need to be a filter coil, but may be a coil for other uses.

The fixing structure according to each embodiment is applied to the filter coil 27, which is mounted on an inverter 22 (operation control circuit) for the electric motor 16 in the electric compressor 10. However, the fixing structure may be applied to a filter coil 27 mounted on an inverter for a motor in a device other than the electric compressor 10. Alternatively, the fixing structure may be applied to a coil mounted on an operation control circuit for a device other than a motor.

What is claimed is:

1. A fixing structure for an electrical component, comprising:
a heat removing member for removing heat from an electrical component, the heat removing member having a receiving portion for receiving the electrical component;
a separation member that is coupled to the electrical component to separate the electrical component from the heat removing member, wherein the separation member is coupled to the heat removing member; and
a soft material member that is accommodated in the receiving portion to directly contact the receiving portion and the electrical component, wherein the electrical component is mounted on a substrate, an outer circumference of the electrical component is covered and retained by the separation member, and heat of the electrical component is transmitted to the heat removing member via the soft material member.

2. The fixing structure for an electrical component according to claim 1, wherein the receiving portion is an annular wall that extends from the heat removing member.

3. The fixing structure for an electrical component according to claim 2, wherein the separation member is coupled either to the annular wall or the heat removing member at a position outside the annular wall.

4. The fixing structure for an electrical component according to claim 3, wherein the separation member is secured to the heat removing member by screws.

5. The fixing structure for an electrical component according to claim 1, wherein the electrical component is a coil.

6. The fixing structure for an electrical component according to claim 5, wherein the coil is used in an operation control circuit of a motor for an electric compressor.

* * * * *